United States Patent [19]

Borchert

[11] 3,971,011

[45] July 20, 1976

[54] MULTIPLE-LINE DISPLAY SIGNAL GENERATING APPARATUS HAVING A SINGLE LINE POSITION CONTROL

[75] Inventor: Marshall Bond Borchert, Aloha, Oreg.

[73] Assignee: Tektronix, Inc., Beaverton, Oreg.

[22] Filed: Aug. 7, 1975

[21] Appl. No.: 602,630

[52] U.S. Cl. .............................. 340/324 A; 315/392; 324/121 R
[51] Int. Cl.² ......................... G08B 5/36; G06F 3/14
[58] Field of Search ................. 340/324 A, 324 AD; 315/367, 392, 395; 324/121 R

[56] References Cited
UNITED STATES PATENTS

| | | | |
|---|---|---|---|
| 2,549,780 | 4/1951 | Earp................................ | 324/121 R |
| 2,912,673 | 11/1959 | Groenendyke................... | 315/392 X |
| 3,124,884 | 3/1964 | Capecelatro et al............ | 315/392 X |
| 3,406,387 | 10/1968 | Werme............................ | 340/324 A |
| 3,457,505 | 7/1969 | Crosby............................ | 324/121 R |
| 3,474,438 | 10/1969 | Lauher............................ | 340/324 A |
| 3,585,440 | 6/1971 | Lee et al....................... | 340/324 AD |
| 3,641,554 | 2/1972 | Slavin............................ | 340/324 A |
| 3,739,222 | 6/1973 | Hurd............................... | 315/392 X |
| 3,765,009 | 10/1973 | Graves et al................... | 340/324 A |

*Primary Examiner*—David L. Trafton
*Attorney, Agent, or Firm*—George T. Noe

[57] ABSTRACT

A multiple-line display signal generating apparatus is disclosed in which each of a plurality of lines is generated in a normally fixed raster format, wherein any one of the plurality of lines may be selected and positioned wiith respect to the other lines. Programmed current generators provide a fixed displacement current for each line, and a variable displacement current may be selected to replace any of the fixed values.

11 Claims, 3 Drawing Figures

MULTIPLE-LINE DISPLAY SIGNAL GENERATING APPARATUS HAVING A SINGLE LINE POSITION CONTROL

BACKGROUND OF THE INVENTION

The present invention relates to a display apparatus for displaying a plurality of electrical signals and more particularly to a raster-scanned terminal display device such as a cathode-ray tube in which a single line may be selected and positioned with respect to a plurality of fixed-position lines.

One form of information display apparatus, the oscilloscope, has the capability of displaying several electrical signals at substantially the same time, wherein a plurality of amplifier channels are enabled on a time-sharing basis known in the art as chopping and alternate display modes. For this type of operation, an amplifier channel is required for each signal, each amplifier channel having a position control to establish the vertical position of the baseline, or horizontal trace associated therewith. It can be readily appreciated that this system, while permitting display of as many as eight channels of information, has many drawbacks. Each amplifier channel having independent controls must be connected to a signal source, resulting in a multiplicity of cables, probes, or signal leads. Each signal, its amplitude, and its relative display vertical position must be kept track of, leading to confusion and error. The confusion becomes particularly noticeable if all the signals are similar, such as digital logic waveforms as opposed to analog waveforms.

Waveform recorders and logic analyzers are presently available which are capable of storing the digital equivalents of a plurality of electrical waveforms. The recorded waveforms may then be accessed individually on a time-sharing basis and applied via a single amplifier channel to a utilization device, such as an oscilloscope, X-Y plotter, strip chart recorder, computer, or even another storage device. When particularly applied to an oscilloscope or a cathode-ray tube display monitor, the waveforms may be applied one line at a time in a fixed raster format at a rate fast enough to produce a multiple-line flicker-free display. This is achieved by applying a stairstep signal to the vertical deflection plates, each step corresponding to a line and having the waveform superimposed thereon for display. In synchronism with each stair step, a sawtooth signal is applied to the horizontal deflection plates to provide a time base sweep. The resultant multiple-line display of several waveforms fixedly spaced from one another is produced at a rate higher than the critical fusion frequency of the human eye, permitting flicker-free simultaneous viewing thereof.

While several waveforms may be examined simultaneously in this manner, it is difficult to ascertain timing relationships between non-adjacent lines. One attempted solution to this problem was the superposition of precisely spaced triggers on the waveform, coupled with a capability of expanding the time scale to permit examination of a relatively short time duration. However, a major drawback of this mode of operation is that as the time scale is expanded, the fraction of viewable waveforms becomes smaller, reducing to nothing more than a series of straight lines at which the operator must guess are high or low, and leading and trailing edges which deprive the operator of a comprehensible perspective of the displayed information.

SUMMARY OF THE INVENTION

According to the present invention, programmable current generators develop a line by line raster for a display apparatus, wherein any one horizontal line may be selected and positioned vertically with respect to the other lines. A clock pulse is produced in synchronization with each sweep sawtooth waveform of the display apparatus, such clock pulse being applied to a binary counter. The program output of the binary counter is applied simultaneously to the programmable current generators, to a display channel selector, and to a comparator.

As the output of the binary counter is incremented through a count sequence, parallel current generators representing each binary bit from the least significant bit to the most significant bit of the count are programmed on and off in the appropriate combinations to produce the stairstep current levels. The display waveform selected by the channel selector in accordance with the binary count is applied to a buffer amplifier which mixes the waveform analog current with the stairstep raster current whereby each step is modulated by one complete line of waveform information.

The comparator to which the binary count signal is applied may be preset to any count in the sequence to inhibit the programmable current generators for that count only and enable a variable current generator in place thereof. Thus, a stairstep current waveform is generated wherein one step is variable with respect to the other fixed steps. When applied to the vertical deflection plates of the display apparatus, one line of the display is variably positionable with respect to the fixed positions of the other lines.

It is therefore one object of the present invention to position any single line in a raster anywhere within the raster.

It is another object to provide programmable current generators to generate a stairstep raster waveform.

It is a further object to provide a system which facilitates ascertaining timing relationships between non-adjacent lines of a multiple-line display.

It is yet another object to provide a system including programmable fixed and variable current generators which determine the location of each line in a multiple-line display.

Further objects, features, and advantages will be apparent from consideration of the following description taken in conjunction with the accompanying drawings.

DRAWINGS

DETAILED DESCRIPTION OF THE DRAWINGS

Figure 1:
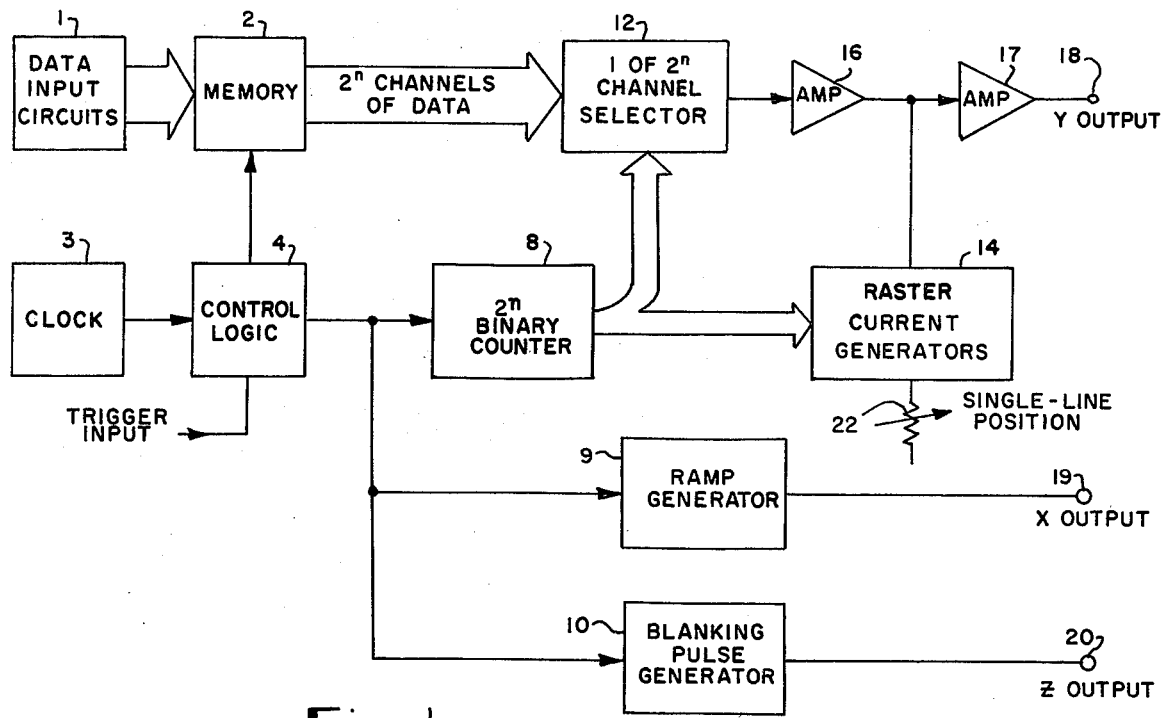
FIG. 1 shows a block diagram of the output circuits of a data storage device having a multiple-line display output.

Turning now to the drawings, FIG. 1 shows a block diagram of the output circuits of a data storage device, or logic analyzer, in which a set of multiple-line display signals are generated. Data input circuits 1, which may conveniently include the usual input amplifiers, analog-to-digital converters, and buffer amplifiers found in conventional data storage devices, acquires data from one or more sources to be stored in a memory device 2. The acquired data may be either digital or analog; however, the data stored is in digital form.

The memory 2 may conveniently be a semiconductor memory having a 4096-bit capacity, although many other types of storage devices are available and would be suitable. The 4096-bit memory has a capability of storing any number $2^n$ lines of data containing $4096/2^n$ bits per line. For example, such capacity permits storage of four complete lines each containing 1024 bits, or eight lines containing 512 bits each, or 16 lines containing 256 bits each, etc. The memory 2, then, essentially holds $2^n$ channels of data, each channel to be displayed on a different line of a raster-scanned display.

The timing of all of the readout circuits is controlled by a clock 3, which produces timing signals at a fixed frequency. Control logic 4 derives control signals from the clock signal applied thereto, such control signals addressing the memory locations to simultaneously read out $2^n$ channels of data in parallel and to initiate the line-by-line X, Y, and Z outputs. Additionally, the control logic 4 may accept an externally applied triggering signal to synchronize the displayed data in conventional triggered, pre-triggered, and post-triggered modes. Control logic 4 may conveniently include conventional flip-flop and counter devices to effect control of the timing signals.

One timing signal from control logic 4 is simultaneously applied to a program logic circuit 8, a ramp generator 9, and a blanking pulse generator 10. The program logic circuit 8, which may suitably be a $2^n$ binary counter, counts from 0 to $2^n$ - 1, advancing one count with receipt of each control signal. The 0 to $2^n$ - 1 program logic signal is applied to a "1 of $2^n$" selector 12 and to programmable current generators 14. Each channel of data is selected in accordance with the program logic and passed from selector 12 to an amplifier 16. The current generators 14 produce a stairstep current in accordance with the program logic, such current being mixed with the data current at the output of amplifier 16. Each step in the stairstep current corresponds to a line to be displayed. The resulting signal is applied to amplifier 17 for final amplification and is available at terminal 18 as a vertical, or Y signal.

A time base ramp is developed by ramp generator 9 for each control signal from control logic 4 and is available at terminal 19 concurrently with each step of vertical information. A blanking pulse generator 10 produces a short-duration pulse which is available at terminal 20 as the Z output signal to modulate the intensity of a cathode ray tube electron beam so that reset portions of the ramp signal are blanked from the display. The X, Y, and Z outputs may be applied to a utilization device such as an oscilloscope or a terminal display device to provide a line-by-line display of $2^n$ channels of displayed data.

In addition to developing fixed incremental steps of raster current, the current generators 14 may also be conditioned to substitute a variable current source for any of the fixed steps, so that an operator may select any line from the display and manually position it with respect to the other lines using a single-line positioning control 22. This operation can best be understood with reference to FIG. 2.

Figure 2:
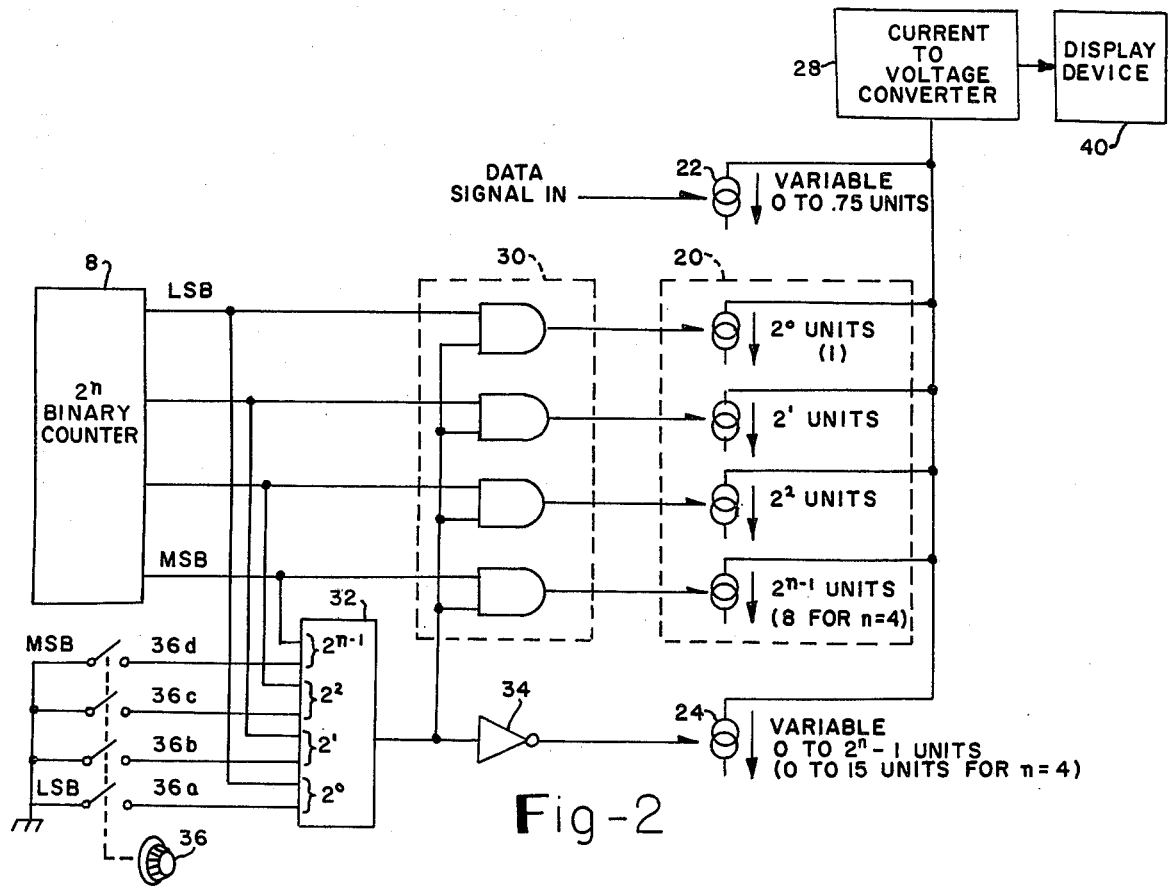
FIG. 2 shows a block diagram of the multiple-line current generator portion of the Y output circuits of a data storage device including a single-line position control according to the present invention.

FIG. 2 shows a block diagram of the current generator portion of a data storage device as hereinabove described. A programmable current generator 20, a variable current generator 22, and a variable current generator 24 share a common output line 26 to a current-to-voltage converter 28. These current generators are appropriately scaled so that a meaningful display may be generated. For example, the programmable current generator 20 produces incremental steps of current to vertically displace each line of the raster, whereby each increment is one normalized unit. The variable current generator 22 may suitably be a current amplifier which is controlled by a data signal coming in, and has an output which is variable from zero to about 0.75 normalized units. This allows information to be displayed on a given line without overlapping an adjacent line.

The output of program logic binary counter 8 is simultaneously applied to an inhibit gate 30 and to a comparator 32. The output of comparator 32 is also applied to inhibit gate 30, and to an inverting amplifier 34 which in turn controls the enable-inhibit function of variable current source 24. The output of inhibit gate 30 controls the enable-inhibit function of programmable current generator 20. The number of output lines of binary counter 8, and consequently, the number of logic gates contained in inhibit gate 30 and comparator 32, are equal to the number of individual current sinks or sources contained in programmable current generator 20, and may suitably be any value $n$. For this discussion, let $n = 4$.

The binary counter 8, then, has four output lines having weighted values of 1, 2, 4, and 8 in the conventional binary coded system, and counts from zero to 15 in the well-known manner. As shown in FIG. 2, the "1" output line is labelled LSB (least significant bit) and the "8" line is labelled MSB (most significant bit). The count signal is compared to selectable logic levels at comparator 32. The selectable logic levels are selected by a switch 36 having a contact for each comparison input line, such contacts 36a - 36b being selectable in any combination to correspond to any number of the counter.

Taking first the case where contacts 36a through 36d are all open, comparator 32 is conditioned to have a logical high output, which is applied to the inhibit gate 30 and to the inverting amplifier 34. The low output of amplifier 34 is applied to variable current generator 24 as a control signal to inhibit operation thereof. The logic gates of inhibit gate 30 are shown as AND gates, and it can be appreciated that as the count signal is applied thereto, the programmable current generators 20 are enabled in accordance with the count. The current sinks or sources of current generator 20 produce 1, 2, 4, and 8 normalized units of current, so 0 to 15 units of current are sequentially generated in a stairstep fashion. This current is mixed with the data current from variable current generator 22 and converted to a display voltage by converter 28. The display voltage is in turn applied to the vertical axis of a display device so that a multiple-line display of data is produced therein.

The single-line position control is selected as follows: Any line from 1 to 16 may be selected for positioning by selector switch 36, which closes the appropriate contacts 36a - 36d to apply a logical high (ground, in this case) to comparator 32. For all of the non-selected numbers of the count, the output of comparator 32 remains high and the entire circuit operates as hereinabove described. However, at the particular count corresponding to the line selected for positioning, the output of comparator 32 trips to its low state, producing a low at the outputs of all of the gates of inhibit gate 30 and producing a high at the output of inverting amplifier 34. That is, the programmable current generator 20 is inhibited for one count while variable current generator 24 is enabled for that count. Variable current generator 24 produces a manually adjustable current from zero to $2^n-1$ units, which is 0 to 15 units for $n = 4$, to provide a full range of vertical line positioning over the display.

Figure 3:
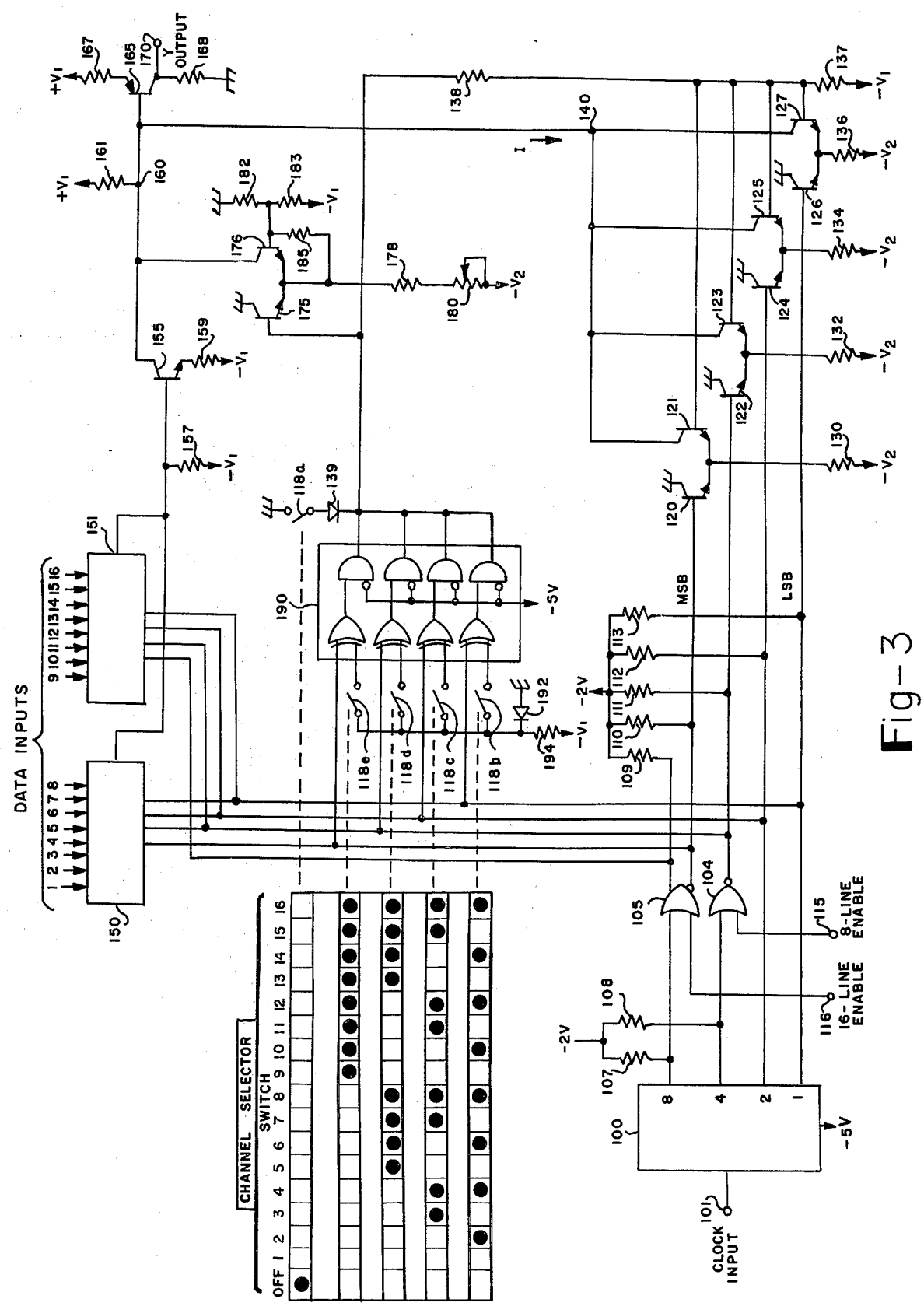
FIG. 3 shows a detailed schematic of the multiple-line display generating apparatus including a single-line position control according to the present invention.

FIG. 3 shows a detailed schematic of the multiple-line display generating apparatus including a single-line positioning control according to the present invention.

Binary counter 100 and its associated circuitry are shown in the lower left portion of FIG. 3. Binary counter 100 may suitably be a commercially available 10136 4-bit counter. An input clock signal is applied to terminal 101 in synchronism with each display sweep. Four outputs having weighted values of 1, 2, 4, and 8 are shown, with OR gates 104 and 105 connected to the 4 and 8 outputs respectively. Resistors 107, 108, 109, 110, 111, 112, and 113 are connected from the counter output lines to a nominal −2 volts to terminate the emitter follower outputs of the logic devices. The gates 104 and 105 permit selection of 4-trace, 8-trace, or 16-trace displays. For a 4-trace display, terminals 115 and 116 are held high, inhibiting the "4" and "8" outputs of the counter and thereby allowing the count to go from 0 to 3 only. For an 8-trace display, terminal 115 is pulled low, enabling gate 104, while terminal 116 is held high, thereby allowing the count to go from 0 to 7. For a 16-trace display, both terminals 115 and 116 are pulled low to enable both gates 104 and 105, allowing the count to go from 0 to 15. The count signal from counter 100 is high for logical 1 and low for logical 0, thus 0000 = and 1111 = 15 in accordance with the rules of binary mathematics.

Any channel or trace may be selected for positioning by channel selector 118 having contact 118a, 118b, 118c, 118d and 118e. Selector 118 may be a cam-actuated 17 position switch including an OFF position. FIG. 3 shows the switch logic, in which each dot indicates closure of the contact associated therewith.

The programmable current generators include transistors 120, 121, 122, 123, 124, 125, 126, and 127 connected as four comparators, which are returned to a source of negative voltage $-V_2$ through emitter resistors 130, 132, 134, and 136. A resistor 137 is connected between the bases of transistors 121, 123, 125, and 127 to a suitable source of negative voltage $-V_1$. To simplify the discussion, assume that the emitter voltage is −2 volts, $V_2 = -34$ volts, and that the values of resistors 130, 132, 134, and 136 are 4 kΩ, 8 kΩ, 16 kΩ, and 32 kΩ respectively. Thus resistor 130 sinks 8 mA of current, resistor 132 sinks 4 mA, resistor 134 sinks 2 mA, and resistor 136 sinks 1 mA. Further assume that selector 118 is in the OFF position, so that contact 118a is closed and the bases of transistors 121, 123, 125, and 127 are at −1.2 volts through resistor 138 and a diode 139. When the counter output is 0000, transistors 121, 123, 125, and 127 conduct while transistors 120, 122, 124, and 126 are off, and the current into node 140 is 15 mA. At count 1, or 0001, the base of transistor 126 is pulled more positive than the base of transistor 127, diverting one milliampere of current through transistor 126 and thereby reducing the current at node 140 to 14 mA. At count 2, or 0010, transistor 124 is turned on while transistor 125 is turned off, reducing the current at node 140 to 13 mA. As the count progresses to 15, the current reduces incrementally in one-milliampere steps until the current reduces to zero at count 15, or 1111.

Up to sixteen channels for display are applied to channel selectors 150 and 151, which may be, for example, commercially-available 10164 eight-line multiplexers. As the count from counter 100 proceeds from zero to 15, channels 1 through 16 are enabled one at a time in sequence to allow the data to be applied to the base of transistor 155. Transistor 155 is operated as an amplifier, and includes base resistor 157, which also serves as a terminating resistor for channel selectors 150 and 151, and emitter resistor 159 connected to a suitable source of negative voltage $-V_1$ to complete a base-emitter biasing loop. The data current produced by transistor 155, which may vary from 0 to about 0.75 mA, is mixed with the stairstep raster current from node 140 at node 160, such current flowing through resistor 161 and developing a voltage thereacross which is an ascending stairstep waveform having a line of data superimposed thereon at each step. This waveform is inverted and amplified by transistor 165, which is connected between a suitable source of voltage $+V_1$ and ground through emitter resistor 167 and collector resistor 168, and made available to an output terminal 170 in the form of a descending stairstep voltage waveform having data waveshapes superimposed on each step. Terminal 170 may be connected to the vertical input terminal of a display device so that a display is produced wherein 16 lines of data are presented in a descending order at a rate higher than the critical fusion frequency of the human eye.

The single-line position control of any one of the 16 lines in the display is effected as follows: Transistors 175 and 176 form a comparator similar to those discussed for the programmable current generators. The emitters thereof are connected together and to $-V_2$ through a fixed resistor 178 and a variable resistor 180, forming a variable current source which is variable from zero to about 15 mA. A voltage divider comprising resistors 182 and 183 connected between ground and $-V_1$ sets the base of transistor 176 at a point between the logical high and low levels so that a high at the base of transistor 175 causes transistor 176 to be off, and a low at the base of transistor 175 causes transistor 176 to be on. Resistor 185 may be connected across the base-emitter junction of transistor 176 to permit current flow therethrough in the complete turn-off condition of transistor 176, ensuring a complete positioning range. Otherwise, some collector current may continue to flow when resistor 180 is adjusted to its maximum resistance value.

The count signal from counter 100 is applied to comparator 190, which may suitably be a commercially available 10113 4-bit comparator containing 4 exclusive OR gates followed by 4 AND gates conditioned to operate as buffers. Diode 192 and resistor 194 provide a hard-wired high to be applied to the comparator 190 by selector switch 118.

As a first example, assume that selector switch 118 is set to channel 1, so that the first of the sixteen lines will be positionable. As discernible from the switch logic, all the contacts of switch 118 are open when channel 1 is selected. At the first count, or 0000, from counter 100, the output of comparator 190 is low, turning transistor 175 off and transistor 176 on. At the same time, resistor 137 pulls the bases of the programmable current generator transistors 121, 123, 125, and 127 more negative than the bases of transistors 120, 122, 124, and 126, which are all at the low state, so that total current at node 140 is zero. For count 0000 corresponding to the first line, then, the only current furnished to node 160 is data current from transistor 155 and positioning current from transistor 176, which may be varied by adjusting resistor 180. Immediately upon change of the count to 0001, the output of comparator 190 goes high and the conditions exist as previously described for closure of contact 118a; i.e., transistor 175 on, transistor 176 off, transistor 121, 123, 125, and 126 on and transistors 120, 122, 124 and 127 off, so that the current at node 140 is 14 mA. The output of comparator 190 remains high through the remainder of the count because of the continued application of noncomparing counts, which in this example are highs thereto provided by the count signal.

As a second example, assume that channel 9 is selected to be positionable by selector switch 118, closing contact 118e. Closure of contact 118e ensures a high output from comparator 190 for all counts except count 8, corresponding to line 9. At count 8, or 1000, a high applied to an exclusive OR gate already having a high input results in a low thereoutof, and consequently a low at the output of comparator 190. For this count only, then, the programmable current generators are disabled while the variable current generator is enabled as previously described.

It will be obvious to those skilled in the art that many changes may be made in the details of the above-described embodiment of the present invention without departing from the spirit of the invention. For example, component values and logic levels may be altered and yet the same effect may be produced. Therefore, the appended claims are intended to cover all such changes and modifications as fall within the true spirit and scope of this invention.

What I claim as being novel is:
1. A display signal generating apparatus, comprising:
   programming means for producing program logic in a predetermined manner;
   programmable current generator means responsive to said program logic for sequentially producing a plurality of current steps having different fixed magnitudes;
   variable current generator means for producing current having a variable magnitude;
   control circuit means for substituting said variable current for a selectable one of said fixed current steps; and
   output circuit means including current to voltage conversion means responsive to said fixed and variable currents for producing a voltage signal having a plurality of fixed voltage steps and a single variable step to be applied to the vertical axis of a display device.
2. An apparatus according to claim 1 further including data source means for providing data signals and means for mixing said data signals with said voltage signal.
3. An apparatus according to claim 1 wherein said programming means includes clock means for producing timing signals and binary counter means for producing a count signal from 0 to $2^n - 1$, advancing one count for each of said timing signals.
4. An apparatus according to claim 3 further including ramp generator means responsive to said timing signals for producing ramp voltage signals to be applied to the horizontal axis of a display device in synchronization with said voltage steps applied from said output circuit means to said vertical axis of said display device.
5. An apparatus according to claim 3 wherein said programmable current generator means comprises a plurality of transistors, each of said transistors having predetermined resistor means connected between the emitter thereof and a voltage source to produce a substantially constant current therethrough, said plurality of transistors being enabled and inhibited in accordance with said count signals to produce a stairstep raster current.
6. An apparatus according to claim 3 wherein said control circuit means includes switch means for selecting condition logic corresponding to one of said plurality of current steps and comparator means for comparing said count signal with said condition logic and generating a control signal therefrom to control operation of said programmable current generator means and said variable current means.
7. A multiple line display generating apparatus having a single line position control comprising:
   means for generating a synchronization signal;
   ramp generator means responsive to said synchronization signal for producing a ramp signal to be applied to the horizontal axis of a display device to produce horizontal lines thereon;
   raster generator means for producing a stairstep signal to be applied to the vertical axis of said display device to vertically displace said horizontal lines, each step of said stairstep signal being generated in response to said synchronization signal and having a fixed amplitude so that each of said steps corresponds to a single horizontal line;
   selection means for selecting a single step of said stairstep signal and inhibiting said raster generator means during said selected step; and
   positioning means for varying amplitude of said selected step to thereby vary the position of the horizontal line corresponding thereto.
8. An apparatus according to claim 7 further including a source of data signals and means for mixing said data signals with said stairstep signal to provide a multiple-line display of said data signals.
9. An apparatus according to claim 7 wherein said means for generating a synchronization signal includes a binary counter and said raster generator means includes a plurality of current generators corresponding to the significant bits of said binary counter, said current generators being turned on in accordance with the count sequence of said binary counter.
10. An apparatus according to claim 9 wherein said selection means includes a switch and a comparator, said switch conditioning said comparator with significant bits corresponding to a selectable single count in said count sequence, and said comparator receiving said count sequence and producing a control signal at said selectable count to inhibit said raster generator means and enable said positioning means.
11. An apparatus according to claim 7 wherein said positioning means includes a variable current source.

* * * * *

UNITED STATES PATENT OFFICE
CERTIFICATE OF CORRECTION

PATENT NO. : 3,971,011
DATED : July 20, 1976
INVENTOR(S) : MARSHALL BOND BORCHERT It is certified that error appears in the above-identified patent and that said Letters Patent are hereby corrected as shown below:

Column 3, line 27 "ventional triggered." should be --ventional triggered,--

Column 5, line 38 "cal 0, thus 0000 = and 1111 = 15" should be --cal 0, thus 0000 = 0 and 1111 = 15--

Column 5, line 41 "contact" should be --contacts--

Column 7, line 14 "transistor 121," should be --transistors 121,--

Signed and Sealed this

Twenty-third Day of November 1976

[SEAL]

Attest:

RUTH C. MASON
Attesting Officer

C. MARSHALL DANN
Commissioner of Patents and Trademarks